(12) United States Patent
Kim et al.

(10) Patent No.: US 11,372,026 B2
(45) Date of Patent: Jun. 28, 2022

(54) RESISTANCE MEASURING DEVICE AND METHOD

(71) Applicant: Ulsan National Institute of Science and Technology, Ulsan (KR)

(72) Inventors: Jae Joon Kim, Ulsan (KR); Subin Choi, Ulsan (KR)

(73) Assignee: Ulsan National Institute of Science and Technology, Ulsan (KR)

( * ) Notice: Subject to any disclaimer, the term of this patent is extended or adjusted under 35 U.S.C. 154(b) by 316 days.

(21) Appl. No.: 16/672,753

(22) Filed: Nov. 4, 2019

(65) Prior Publication Data

US 2020/0166547 A1    May 28, 2020

(30) Foreign Application Priority Data

Nov. 22, 2018   (KR) ......................... 10-2018-0145321

(51) Int. Cl.
| | |
|---|---|
| *G01R 27/08* | (2006.01) |
| *G01R 15/00* | (2006.01) |
| *G01R 27/02* | (2006.01) |
| *G01R 27/00* | (2006.01) |
| G01R 19/00 | (2006.01) |

(52) U.S. Cl.
CPC .......... *G01R 15/005* (2013.01); *G01R 27/00* (2013.01); *G01R 27/02* (2013.01); *G01R 27/08* (2013.01); *G01R 19/0023* (2013.01)

(58) Field of Classification Search
CPC ........ G01R 27/02; G01R 27/14; G01R 1/203; G01R 27/16; G01R 15/005; G01R 27/08; G01R 27/00; G01R 19/0023; H01L 2924/0002; H01L 2924/00; H01L 22/34; H01L 21/28518
USPC ... 324/76.11–76.83, 459, 600, 649, 691, 705
See application file for complete search history.

(56) References Cited

U.S. PATENT DOCUMENTS

| | | | | |
|---|---|---|---|---|
| 2006/0227639 | A1* | 10/2006 | Srowik ................. | G11C 16/26 365/207 |
| 2013/0119952 | A1* | 5/2013 | Weng ..................... | G06F 1/305 323/265 |
| 2017/0371363 | A1* | 12/2017 | Habu ..................... | H05B 45/37 |
| 2019/0146018 | A1* | 5/2019 | Nakamura ............. | G01R 15/09 324/713 |
| 2019/0331724 | A1* | 10/2019 | Ikushima ............... | G01R 31/50 |

* cited by examiner

*Primary Examiner* — Raul J Rios Russo
(74) *Attorney, Agent, or Firm* — Maier & Maier, PLLC

(57) ABSTRACT

A resistance measuring device includes an amplifying unit including an amplifier, a first and a second current supply unit, a voltage detection unit, and a controller. The controller controls the voltage detection unit to detect a first output voltage of an output terminal of the amplifier in a state where the current of the first current source flows in a forward direction to a measurement target resistor by controlling the first current supply unit, controls the voltage detection unit to detect a second output voltage of the output terminal of the amplifier in a state where the current of the second current source flows in a reverse direction to the measurement target resistor by controlling the second current supply unit, and calculates a resistance value of the measurement target resistor based on the detected first output voltage and the detected second output voltage.

8 Claims, 2 Drawing Sheets

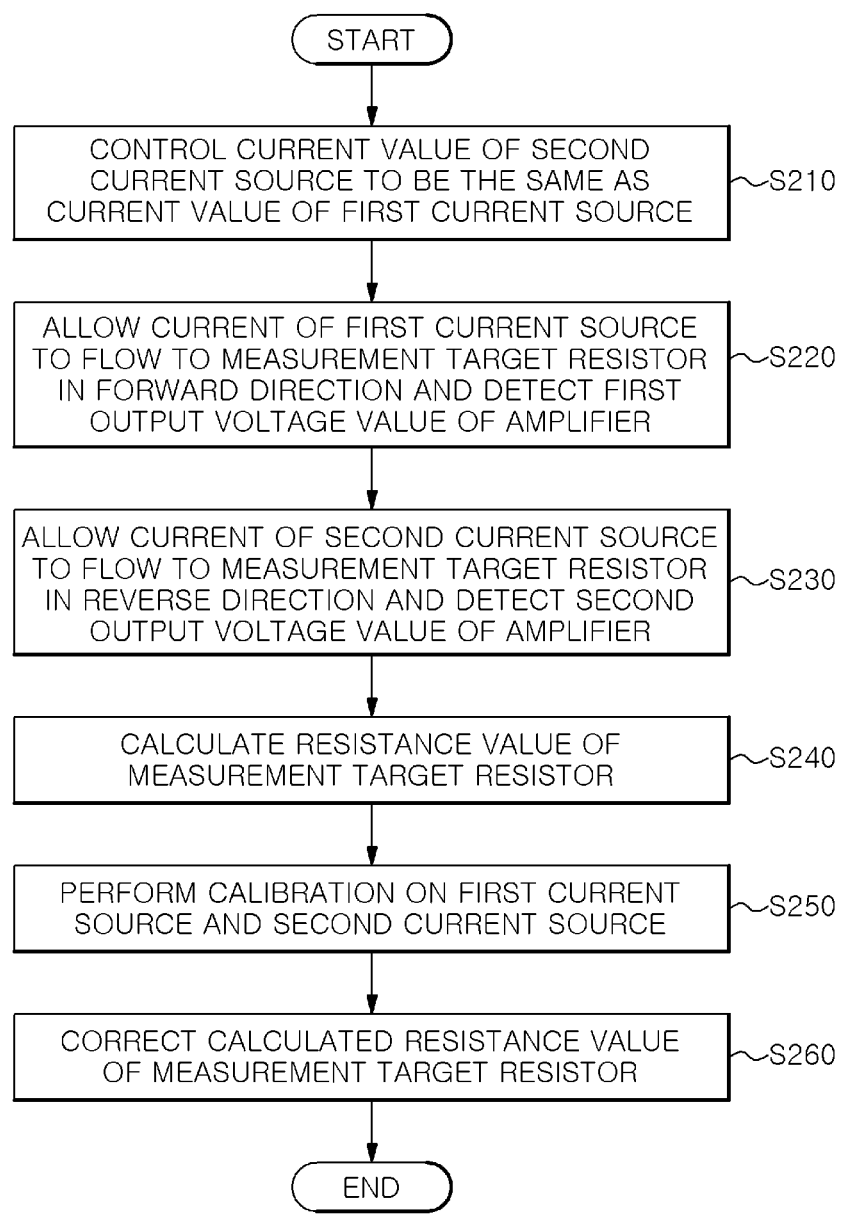

RESISTANCE MEASURING DEVICE AND METHOD

CROSS-REFERENCE TO RELATED APPLICATION

This application claims priority to Korean Patent Application No. 10-2018-0145321, filed on Nov. 22, 2018, the entire contents of which are incorporated herein by reference.

FIELD

The present disclosure relates to a device and a method for measuring a resistance; and, more particularly, to a device and a method capable of accurately measuring a resistance value of a measurement target resistor.

BACKGROUND

As well known, in manufacturing a circuit such as an integrated circuit (IC) or the like, a resistor exhibits sensitive characteristics. The resistor is relatively sensitive to process conditions compared to other elements, which makes it difficult to accurately ensure the resistance value of the resistor.

Therefore, a technique capable of accurately measuring the resistance value of the resistor is required. However, in a conventional technique, the accuracy of the measurement result cannot be guaranteed due to an effect of an offset of an amplifier in a resistance measuring device. As a gain of the amplifier becomes higher, the offset becomes lower. However, it is not possible to increase the gain of the amplifier indefinitely. In addition, since the offset is not completely eliminated, there is a limit in improving the accuracy of the resistance measurement result.

SUMMARY

In view of the above, the present disclosure provides a device and a method for measuring a resistance value of a measurement target resistor without being affected by an offset of an amplifier.

In accordance with a first aspect of the present disclosure, there is provided a resistance measuring device comprising: an amplifying unit including an amplifier wherein a first voltage is inputted to a first input terminal of the amplifier and a measurement target resistor is disposed between a second input terminal and an output terminal of the amplifier; a first current supply unit configured to selectively allow flowing of a current of a first current source connected to a power supply voltage to the second input terminal of the amplifier; a second current supply unit configured to selectively allow flowing of a current of a second current source connected to a ground terminal to the second input terminal of the amplifier; a voltage detection unit configured to detect an output voltage of the output terminal multiple times; and a controller configured to control the first current supply unit, the second current supply unit, and the voltage detection unit, wherein the controller is configured to control the voltage detection unit to detect a first output voltage of the output terminal of the amplifier in a state where the current of the first current source flows in a forward direction to the measurement target resistor by controlling the first current supply unit, control the voltage detection unit to detect a second output voltage of the output terminal of the amplifier in a state where the current of the second current source flows in a reverse direction to the measurement target resistor by controlling the second current supply unit, and calculate a resistance value of the measurement target resistor based on the detected first output voltage and the detected second output voltage.

The amplifying unit may further include a first switching unit disposed between the measurement target resistor and the output terminal of the amplifier, and the resistance measuring device may further comprise: a comparison unit configured to compare the first voltage and a voltage applied to a common contact point of a path in which the current of the first current source flows to the second input terminal of the amplifier, a path in which the current of the second current source flows to the second input terminal of the amplifier, and a path connected to the measurement target resistor; and a current control unit configured to control a current value of the first current source and a current value of the second current source based on an output value of the comparison unit, wherein the controller controls the switching states of the first current supply unit, the second current supply unit and the first switching unit so that the current value of the first current source and the current value of the second current source become the same.

The voltage detection unit may further include: an analog-to-digital converter configured to provide a difference between a first input voltage applied to a first input terminal thereof and a second input voltage applied to a second input terminal thereof to the controller; and a second switching unit configured to selectively allow application of the first output voltage or the second output voltage of the output terminal of the amplifier to the first input terminal or the second input terminal of the analog-to-digital converter depending on the switching states under the control of the controller.

The controller may control the second switching unit to apply a third output voltage of the output terminal of the amplifier to the first input terminal of the analog-to-digital converter in a state where the current of the first current source flows in a forward direction to the measurement target resistor by controlling the first current supply unit and the current of the second current source flows in a reverse direction to the measurement target resistor by controlling the second current supply unit, the controller controls the second switching unit to apply a fourth output voltage of the output terminal of the amplifier to the second input terminal of the analog-to-digital converter in a state where the flowing of the current of the first current source and the current of the second current source to the measurement target resistor is interrupted by controlling the first current supply unit and the second current supply unit, and the controller calculates a difference between a current value of the first current source and a current value of the second current source based on a difference between the third output voltage and the fourth output voltage outputted from the analog-to-digital converter.

The controller may correct the calculated resistance value of the measurement target resistor based on the difference between the current value of the first current source and the current value of the second current source.

The amplifying unit may further include: a first switching unit disposed between the measurement target resistor and the output terminal of the amplifier, and the resistance measuring device may further comprise: a comparison unit configured to compare the first voltage and a voltage applied to a common contact point of a path in which the current of the first current source flows to the second input terminal of the amplifier, a path in which the current of the second current source flows to the second input terminal of the amplifier, and a path connected to the measurement target resistor; and a current control unit configured to control the current value of the first current source and the current value of the second current source based on an output value of the comparison unit, wherein when the current value of the first current source and the current value of the second current source are different, the controller controls the switching states of the first current supply unit, the second current supply unit and the first switching unit so that the current value of the first current source and the current value of the second current source become the same.

In accordance with a second aspect of the present disclosure, there is provided a resistance measuring method for measuring a resistance value of a measurement target resistor in a resistance measuring device, wherein the resistance measuring device includes: an amplifying unit including an amplifier wherein a first voltage is inputted to a first input terminal of the amplifier and a measurement target resistor is disposed between a second input terminal and an output terminal of the amplifier; a first current supply unit configured to selectively allow flowing of a current of a first current source connected to a power supply voltage to the second input terminal of the amplifier; a second current supply unit configured to selectively allow flowing of a current of a second current source connected to a ground terminal to the second input terminal of the amplifier; and a voltage detection unit configured to detect an output voltage of the output terminal of the amplifier multiple times, the resistance measuring method comprising: controlling the voltage detection unit to detect a first output voltage of the output terminal of the amplifier in a state where the current of the first current source flows in a forward direction to the measurement target resistor by controlling the first current supply unit; controlling the voltage detection unit to detect a second output voltage of the output terminal of the amplifier in a state where the current of the second current source flows in a reverse direction to the measurement target resistor by controlling the second current supply unit; and calculating a resistance value of the measurement target resistor based on the detected first output voltage and the detected second output voltage.

The resistance measuring method may further comprise: controlling the voltage detection unit to detect a third output voltage of the output terminal of the amplifier in a state where the current of the first current source flows in a forward direction to the measurement target resistor by controlling the first current supply unit and the current of the second current source flows in a reverse direction to the measurement target resistor by controlling the second current supply unit; controlling the voltage detection unit to detect a fourth output voltage of the output terminal of the amplifier in a state where the flowing of the current of the first current source and the current of the second current source to the measurement target resistor is interrupted by controlling the first current supply unit and the second current supply unit; calculating a difference between a current value of the first current source and a current value of the second current source based on a difference between the detected third output voltage and the detected fourth output voltage; and correcting the calculated resistance value of the measurement target resistor based on the difference between the current value of the first current source and the current value of the second current source.

In accordance with the aspects of the present disclosure, the resistance value of the measurement target resistor is calculated without being affected by the offset of the amplifier and, thus, the accuracy of the resistance measurement result is improved.

BRIEF DESCRIPTION OF THE DRAWINGS

The objects and features of the present disclosure will become apparent from the following description of embodiments, given in conjunction with the accompanying drawings, in which:

FIG. 2 is a flowchart of a process of measuring a resistance value of a measurement target resistor in the resistance measuring device according to the embodiment.

DETAILED DESCRIPTION OF THE EMBODIMENTS

Figure 1:
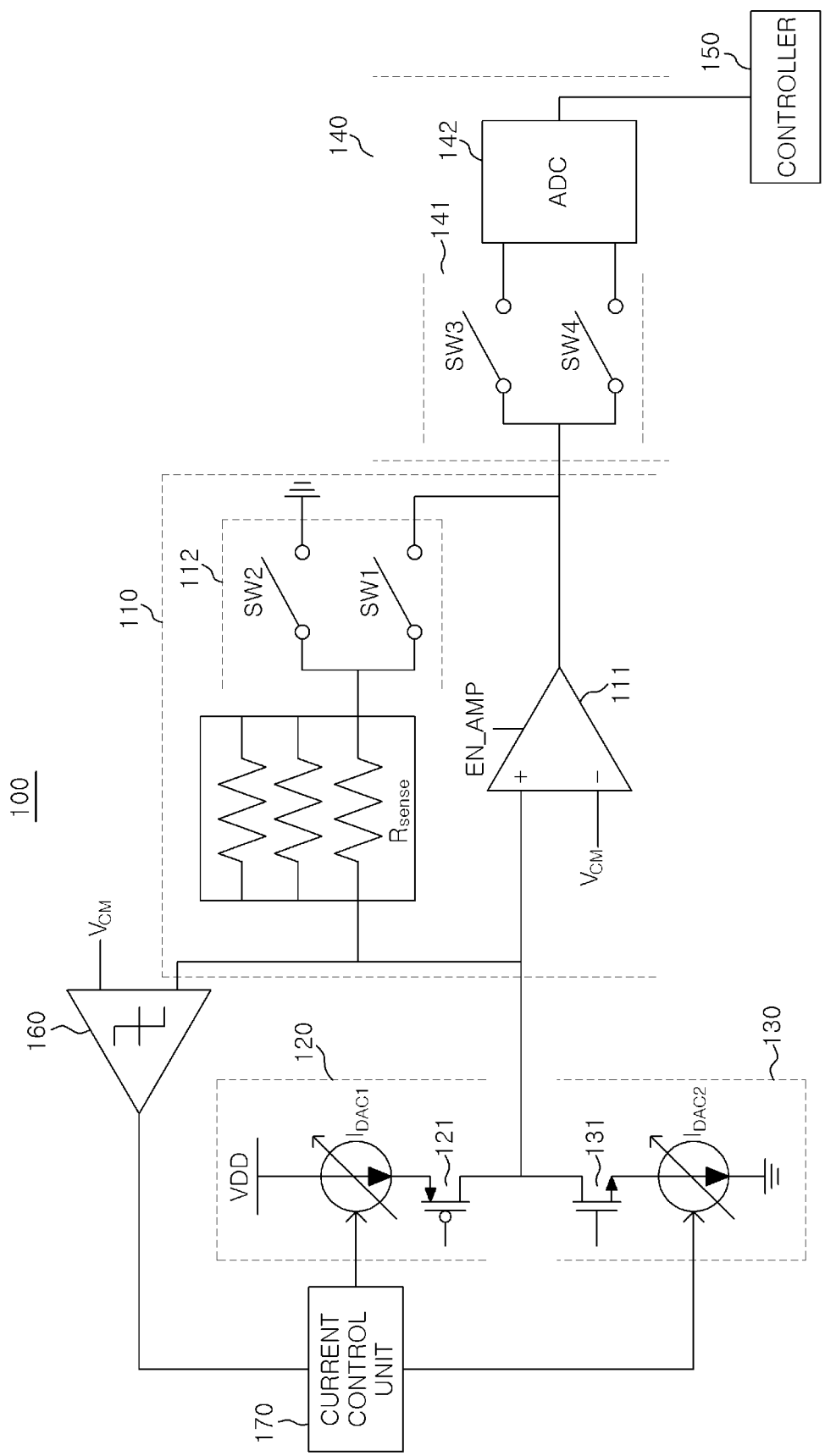
FIG. 1 shows a configuration of a circuit of a resistance measuring device according to an embodiment.

The advantages and features of embodiments and methods of accomplishing these will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

In describing the embodiments of the present disclosure, if it is determined that detailed description of related known components or functions unnecessarily obscures the gist of the present disclosure, the detailed description thereof will be omitted. Further, the terminologies to be described below are defined in consideration of functions of the embodiments of the present disclosure and may vary depending on a user's or an operator's intention or practice. Accordingly, the definition thereof may be made on a basis of the content throughout the specification.

FIG. 1 shows a circuit of a resistance measuring device 100 in accordance with an embodiment of the present disclosure.

As shown in FIG. 1, the resistance measuring device 100 includes an amplifying unit 110, a first current supply unit 120, a second current supply unit 130, a voltage detection unit 140, a controller 150, a comparison unit 160, and a current control unit 170.

In the amplifying unit 110, a first voltage $V_{CM}$ is inputted to a first input terminal (−) of an amplifier 111, and a measurement target resistor $R_{sense}$ is disposed between a second input terminal (+) and an output terminal of the amplifier 111. For example, the amplifier 111 can be implemented as an operational amplifier, and the first voltage $V_{CM}$ can be $V_{DD}/2$ ($V_{DD}$: power supply voltage).

The first current supply unit 120 selectively allows a current of a first current source $I_{DAC1}$ connected to the power supply voltage $V_{DD}$ to flow to the second input terminal (+) of the amplifier 111 depending on a switching state of a first switching element 121. For example, the first switching element 121 can be implemented as a field effect transistor, and the first current source $I_{DAC1}$ can be implemented as a current digital-to-analog converter (IDAC).

The second current supply unit 130 selectively allows a current of a second current source $I_{DAC2}$ connected to a ground terminal to flow to the second input terminal (+) of the amplifier 111 depending on a switching state of a second switching element 131. For example, the second switching element 131 can be implemented as a field effect transistor, and the second current source $I_{DAC2}$ can be implemented as an IDAC.

The voltage detection unit 140 detects an output voltage of the output terminal of the amplifier 111 multiple times under the control of the controller 150.

The controller 150 controls the first current supply unit 120, the second current supply unit 130, and the voltage detection unit 140. The controller 150 controls the voltage detection unit 140 to detect a first output voltage of the output terminal of the amplifier 111 in a state where the current of the first current source $I_{DAC1}$ flows to the resistor $R_{sense}$ in a forward direction by controlling the switching state of the first switching element 121. Further, the controller 150 controls the voltage detection unit 140 to detect a second output voltage of the output terminal of the amplifier 111 in a state where the current of the second current source $I_{DAC2}$ flows to the resistor $R_{sense}$ in a reverse direction by controlling the switching state of the second switching element 131. Further, the controller 150 calculates the resistance value of the measurement target resistor $R_{sense}$ based on the detected first output voltage and the detected second output voltage.

In accordance with the embodiment, the amplifying unit 110 further includes a first switching unit 112 disposed between the measurement target resistor $R_{sense}$ and the output terminal of the amplifier 111. For example, the first switching unit 112 includes a first switch SW1 for selectively allowing connection between one end of the measurement target resistor $R_{sense}$ and the output terminal of the amplifier 111 and a second switch SW2 for selectively allowing connection between one end of the measurement target resistor $R_{sense}$ and a ground terminal.

The resistance measuring device 100 further includes the comparison unit 160 for comparing the first voltage $V_{CM}$ and a voltage applied to a common contact point of a path in which the current of the first current source $I_{DAC1}$ flows to the second input terminal (+) of the amplifier 111, a path in which the current of the second current source $I_{DAC2}$ flows to the second input terminal (+) of the amplifier 111, and a path connected to the measurement target resistor $R_{sense}$. The resistance measuring device 100 further includes the current control unit 170 for controlling the current values of the first current source $I_{DAC1}$ and the second current source $I_{DAC2}$ based on the output value of the comparison unit 160. With the comparison unit 160 and the current control unit 170 provided as described above, the controller 150 can control the switching states of the first current supply unit 120, the second current supply unit 130 and the first switching unit 112 so that the current value of the first current source $I_{DAC1}$ and the current value of the second current source $I_{DAC2}$ become the same. For example, when the current value of the first current source $I_{DAC1}$ and the current value of the second current source $I_{DAC2}$ are different, the controller 150 can control the switching states of the first current supply unit 120, the second current supply unit 130 and the switching unit 112 so that the current value of the first current source $I_{DAC1}$ and the current value of the second current source $I_{DAC2}$ become the same. For example, the current control unit 170 can be implemented as a successive approximation register analog-to-digital converter (SAR ADC).

In accordance with the embodiment, the voltage detection unit 140 further includes an analog-to-digital converter (ADC) 142 for digitally coding a difference between a first input voltage applied to the first input terminal and a second input voltage applied to the second input terminal and providing the difference to the controller 150. Further, the voltage detection unit 140 further includes a second switching unit 141 for selctively allowing application of the first output voltage or the second output voltage of the output terminal of the amplifier 111 to the first input terminal or the second input terminal of the ADC 142 depending on the switching states under the control of the controller 150.

For example, the second switching unit 141 includes a third switch SW3 for selctively allowing the connection between the output terminal of the amplifier 111 and the first input terminal of the ADC 142 and a fourth switch SW4 for selctively allowing the connection between the output terminal of the amplifier 111 and the second input terminal of the ADC 142. When the voltage detection unit 140 further includes the ADC 142 and the second switching unit 141 as described above, the controller 150 can control the second switching unit 141 to apply a third output voltage of the output terminal of the amplifier 111 to the first input terminal of the ADC 142 in a state where the current of the first current source $I_{DAC1}$ flows to the measurement target resistor $R_{sense}$ in a forward direction by controlling the first current supply unit 120 and the current of the second current source $I_{DAC2}$ flows to the measurement target resistor $R_{sense}$ in a reverse direction by controlling the second current supply unit 130.

Further, the controller 150 can control the second switching unit 141 to apply a fourth output voltage of the output terminal of the amplifier 111 to the second input terminal of the ADC 142 in a state where the flowing of the current of the first current source $I_{DAC1}$ and the current of the second current source $I_{DAC2}$ to the measurement target resistor $R_{sense}$ is interrupted by controlling the first current supply unit 120 and the second current supply unit 130. Further, the controller 150 can calculate the difference between the current value of the first current source $I_{DAC1}$ and the current value of the second current source $I_{DAC2}$ based on the difference between the third output voltage and the fourth output voltage outputted from the ADC 142. Further, the controller 150 can correct the calculated resistance value of the measurement target resistor $R_{sense}$ based on the difference between the current value of the first current source $I_{DAC1}$ and the current value of the second current source $I_{DAC2}$.

FIG. 2 is a flowchart showing a process of measuring a resistance value of a measurement target resistor in the resistance measuring device according to the embodiment of the present disclosure.

Hereinafter, the operation of measuring the resistance value of the measurement target resistor in the resistance measuring device according to the embodiment of the present disclosure will be described in detail with reference to FIGS. 1 and 2.

First, the controller 150 allows the resistance measuring device 100 to operate in a first mode by turning on the first switching element 121 of the first current supply unit 120, turning off the second switching element 131 of the second current supply unit 130, turning off the first switch SW1 of the first switching unit 112, turning on the second switch SW2 of the first switching unit 112, and turning off the amplifier 111.

In the first mode, the current of the first current source $I_{DAC1}$ flows to the measurement target resistor $R_{sense}$. The comparison unit 160 provides the result of comparison between the voltage applied to the measurement target resistor $R_{sense}$ and the first voltage $V_{CM}$ (common mode voltage) to the current control unit 170. The current control unit 170 controls the current value of the first current source $I_{DAC1}$ based on the result of comparison between the voltage applied to the measurement target resistor $R_{sense}$ and the first voltage $V_{CM}$. Here, since the resistance value of the measurement target resistor $R_{sense}$ is not given, the current control unit 170 controls the current value of the first current source $I_{DAC1}$ to be within a voltage range at which the amplifier 111 can be driven so that the voltage applied to the measurement target resistor $R_{sense}$ and the first voltage $V_{CM}$ can become close to each other.

In a step S210, the current control unit 170 controls the current value of the second current source $I_{DAC2}$ to be the same example, the successive approximation register analog-to-digital converter, which can be implemented as the current control unit 170, can control the current value of the second current source $I_{DAC2}$ using the code value acquired at the time of controlling the current value of the first current source $I_{DAC1}$.

Next, in a step S220, the controller 150 allows the resistance measuring device 100 to operate in a second mode by turning on the first switching element 121 of the first current supply unit 120, turning off the second switching element 131 of the second current supply unit 130, turning on the first switch SW1 of the first switching unit 112, turning off the second switch SW2 of the first switching unit 112, turning on the amplifier 111, turning on the third switch SW3 of the second switching unit 141, and turning off the fourth switch SW4 of the second switching unit 141.

In the second mode, the current of the first current source $I_{DAC1}$ flows to the measurement target resistor $R_{sense}$ in the forward direction and a voltage of $V_{CM}+V_{offset}$ is applied to the second input terminal (+) of the amplifier 111. Since the voltage $V_{CM}$ is applied to the first input terminal (−) of the amplifier 111, the second input terminal (+) has a voltage close to the voltage $V_{CM}$ due to the characteristics of the amplifier 111. However, the voltage of $V_{CM}+V_{offset}$ is actually applied to the second input terminal (+) due to a DC offset value of the amplifier 111.

Then, a voltage shown in the following Eq. (1) is outputted from the output terminal of the amplifier 111 to be provided to the voltage detection unit 140 and applied to the first input terminal of the ADC 142 through the third switch SW3 of the second switching unit 141. The voltage applied to the first input terminal of the ADC 142 is stored as a first output voltage value $V_{out1}$ of the amplifier 111.

$$V_{out1}=V_{CM}+V_{offset}-R_{sense}I_{DAC1} \quad \text{Eq. (1)}$$

Then, in a step S230, the controller 150 allows the resistance measuring device 100 to operate in a third mode by turning off the first switching element 121 of the first current supply unit 120, turning on the second switching element 131 of the second current supply unit 130, turning on the first switch SW1 of the first switching unit 112, turning off the second switch SW2 of the first switching unit 112, turning on the amplifier 111, turning off the third switch SW3 of and the second switching unit 141, and turning on the fourth switch SW4 of the second switching unit 141.

In the third mode, the current of the second current source $I_{DAC2}$ flows to the measurement target resistor $R_{sense}$ in the reverse direction, and the voltage of $V_{CM}+V_{offset}$ is applied to the second input terminal (+) of the amplifier 111. Since the voltage $V_{CM}$ is applied to the first input terminal (−) of the amplifier 111, the second input terminal (+) has a voltage close to the voltage $V_{CM}$ due to the characteristics of the amplifier 111. However, the voltage of $V_{CM}+V_{offset}$ is actually applied to the second input terminal (+) due to the DC offset value of the amplifier 111.

Then, a voltage shown in the following Eq. (2) is outputted from the output terminal of the amplifier 111 to be provided to the voltage detection unit 140 and applied to the second input terminal of the ADC 142 through the fourth switch SW4 of the second switching unit 141. The ADC 142 outputs the difference between the first output voltage $V_{out1}$ applied to the first input terminal of the ADC 142 and stored and the second output voltage $V_{out2}$ applied to the second input terminal of the ADC 142 as shown in the following Eq. (3). At this time, the DC offset of the amplifier 111 included in the first output voltage value $V_{out1}$ and the second output voltage value $V_{out2}$ is removed.

$$C_{out2}=V_{CM}+V_{offset}+R_{sense}I_{DAC2} \quad \text{Eq. (2)}$$

$$V_{out2}-V_{out1}=R_{sense}I_{DAC1}+R_{sense}I_{DAC2} \quad \text{Eq. (3)}$$

Next, in a step S240, the controller 150 calculates the resistance value of the measurement target resistor $R_{sense}$ based on the output value of the ADC 142. Here, since the current value of the first current source $I_{DAC1}$ and the current value of the second current source $I_{DAC2}$ are the same, the difference between the first output voltage and the second output voltage can be expressed by the following Eq. (4). Further, since the current value of the first current source $I_{DAC1}$ is given, the resistance value of the measurement target resistor $R_{sense}$ can be calculated.

$$V_{out2}-V_{out1}=2R_{sense}I_{DAC1} \quad \text{Eq. (4)}$$

Although the current value of the first current source $I_{DAC1}$ and the current value of the second current source $I_{DAC2}$ are set to be the same, the current values of the first current source $I_{DAC1}$ and the second current source $I_{DAC2}$ may change. In that case as well, the resistance value of the measurement target resistor $R_{sense}$ can be accurately calculated as long as the difference between the current value of the first current source $I_{DAC1}$ and the current value of the second current source $I_{DAC2}$ is accurately obtained.

In a step S250, the controller 150 allows the resistance measuring device 100 to operate in a calibration mode by turning on the first switching element 121 of the first current supply unit 120, turning on the second switching element 131 of the second current supply unit 130, turning on the first switch SW1 of the first switching unit 112, turning off the second switch SW2 of the first switching unit 112, turning on the amplifier 111, turning on the third switch SW3 of the second switching unit 141, and turning off the fourth switch SW4 of the second switching unit 141.

When the resistance measuring device 100 operates in the calibration mode, the current corresponding to the difference between the current of the first current source $I_{DAC1}$ and the current of the second current source $I_{DAC2}$ flows to the measurement target resistor $R_{sense}$ in the forward direction, and the voltage of $V_{CM}+V_{offset}$ is applied to the second input terminal (+) of the amplifier 111. Then, a voltage shown in the following Eq. (5) is outputted from the output terminal of the amplifier 111 to be provided to the voltage detection unit 140 and applied to the first input terminal of the ADC 142 through the third switch SW3 of the second switching unit 141. The voltage applied to the first input terminal of the ADC 142 is stored as a third output voltage $V_{out3}$ of the amplifier 111.

$$V_{out3}=V_{CM}+V_{offset}+R_{sample}(I_{DAC1}-I_{DAC2}) \quad \text{Eq. (5)}$$

Then, in the calibration mode, the controller 150 turns off the first switching element 121 of the first current supply unit 120, turns off the second switching device of the second current supply unit 130, turns on the first switch SW1 of the first switching unit 112, turns off the second switch SW2 of the first switching unit 112, turns on the amplifier 111, turns off the third switch SW3 of the second switching unit 141, and turns on the fourth switch SW4 of the second switching unit 141.

Then, the voltage of $V_{CM}+V_{offset}$ is applied to the second input terminal (+) of the amplifier 111, and a fourth output voltage shown in the following Eq. (6) is outputted from the output terminal of the amplifier 111 to be applied to the second input terminal of the ADC 142 through the fourth switch SW4 of the second switching unit 141. The ADC 142 outputs the difference between the third output voltage $V_{out3}$ applied to the first input terminal of the ADC 142 and stored and the fourth output voltage $V_{out4}$ applied to the second input terminal of the ADC 142 is outputted as shown in the following Eq. (7).

$$V_{out4}=V_{CM}+V_{offset} \quad\quad \text{Eq. (6)}$$

$$V_{out4}-V_{out3}=R_{sample}(I_{DAC1}-I_{DAC2}) \quad\quad \text{Eq. (7)}$$

In a step S260, the voltage value outputted from the ADC 142 of the voltage detection unit 140, which is obtained by the Eq. (7), is provided to the controller 150. Since the difference between the current value of the first current source $I_{DAC1}$ and the current value of the second current source $I_{DAC2}$ is given, the controller 150 corrects the resistance value of the measurement target resistor $R_{sense}$ calculated in the step S240 based on the difference between the current value of the first current source $I_{DAC1}$ and the current value of the second current source $I_{DAC2}$.

As described above, in accordance with the embodiment of the present disclosure, the resistance value of the measurement target resistor is calculated without being affected by the offset of the amplifier and, thus, the accuracy of the resistance measurement result is improved.

Combinations of blocks in the flowcharts of the present disclosure can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the steps of the flowchart. These computer program instructions may also be stored in a computer usable or computer readable memory that can direct a computer or other programmable data processing apparatuses to function in a particular manner, such that the instructions stored in the computer usable or computer readable medium can produce an article of manufacture including instructions which implement the function specified in the blocks of the flowcharts. The computer program instructions may also be loaded onto a computer or other programmable data processing apparatuses to cause a series of operational steps to be performed on the computer or other programmable apparatuses to produce a computer implemented process such that the instructions which execute on the computer or other programmable apparatuses provide processes for implementing the functions specified in the blocks of the flowcharts.

Each block in the flowchart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A resistance measuring device comprising:
  a processor and one or more memory devices communicatively coupled to the processor;
  an amplifying unit including an amplifier wherein a first voltage is inputted to a first input terminal of the amplifier and a measurement target resistor is disposed between a second input terminal and an output terminal of the amplifier;
  a first current supply device that is communicatively coupled to the processor, wherein the one or more memory devices stores instructions operable when executed by the processor to cause the first current supply device to selectively allow flowing of a current of a first current source connected to a power supply voltage to the second input terminal of the amplifier;
  a second current supply device that is communicatively coupled to the processor, wherein the instructions stored in the one or more memory devices are further operable when executed by the processor to cause the second current supply device to selectively allow flowing of a current of a second current source connected to a ground terminal to the second input terminal of the amplifier;
  a voltage detection device that is communicatively coupled to the processor, wherein the instructions stored in the one or more memory devices are further operable when executed by the processor to cause the voltage detection device to detect an output voltage of the output terminal multiple times; and
  a controller including the processor and the one or more memory devices communicatively coupled to the processor, wherein the instructions stored in the one or more memory devices are further operable when executed by the processor to cause the controller to control the first current supply device, the second current supply device, and the voltage detection device,
  wherein the controller is configured to control the voltage detection device to detect a first output voltage of the output terminal of the amplifier in a state where the current of the first current source flows in a forward direction to the measurement target resistor by controlling the first current supply device, control the voltage detection device to detect a second output voltage of the output terminal of the amplifier in a state where the current of the second current source flows in a reverse direction to the measurement target resistor by controlling the second current supply device, and calculate a resistance value of the measurement target resistor based on the detected first output voltage and the detected second output voltage.

2. The resistance measuring device of claim 1, wherein the amplifying unit further includes a first switching unit disposed between the measurement target resistor and the output terminal of the amplifier, the resistance measuring device further comprising:
a comparison unit configured to compare the first voltage and a voltage applied to a common contact point of a path in which the current of the first current source flows to the second input terminal of the amplifier, a path in which the current of the second current source flows to the second input terminal of the amplifier, and a path connected to the measurement target resistor; and
a current control unit configured to control a current value of the first current source and a current value of the second current source based on an output value of the comparison unit,
wherein the controller controls the switching states of the first current supply device, the second current supply device and the first switching unit so that the current value of the first current source and the current value of the second current source become the same.

3. The resistance measuring device of claim 1, wherein the voltage detection device further includes:
an analog-to-digital converter configured to provide a difference between a first input voltage applied to a first input terminal thereof and a second input voltage applied to a second input terminal thereof to the controller; and
a second switching unit configured to selectively allow application of the first output voltage or the second output voltage of the output terminal of the amplifier to the first input terminal or the second input terminal of the analog-to-digital converter depending on the switching states under the control of the controller.

4. The resistance measuring device of claim 3, wherein the controller controls the second switching unit to apply a third output voltage of the output terminal of the amplifier to the first input terminal of the analog-to-digital converter in a state where the current of the first current source flows in a forward direction to the measurement target resistor by controlling the first current supply device and the current of the second current source flows in a reverse direction to the measurement target resistor by controlling the second current supply device,
the controller controls the second switching unit to apply a fourth output voltage of the output terminal of the amplifier to the second input terminal of the analog-to-digital converter in a state where the flowing of the current of the first current source and the current of the second current source to the measurement target resistor is interrupted by controlling the first current supply device and the second current supply device, and
the controller calculates a difference between a current value of the first current source and a current value of the second current source based on a difference between the third output voltage and the fourth output voltage outputted from the analog-to-digital converter.

5. The resistance measuring device of claim 4, wherein the controller corrects the calculated resistance value of the measurement target resistor based on the difference between the current value of the first current source and the current value of the second current source.

6. The resistance measuring device of claim 4, wherein the amplifying unit further includes:
a first switching unit disposed between the measurement target resistor and the output terminal of the amplifier,
the resistance measuring device further comprising:
a comparison unit configured to compare the first voltage and a voltage applied to a common contact point of a path in which the current of the first current source flows to the second input terminal of the amplifier, a path in which the current of the second current source flows to the second input terminal of the amplifier, and a path connected to the measurement target resistor; and
a current control unit configured to control the current value of the first current source and the current value of the second current source based on an output value of the comparison unit,
wherein when the current value of the first current source and the current value of the second current source are different, the controller controls the switching states of the first current supply device, the second current supply device and the first switching unit so that the current value of the first current source and the current value of the second current source become the same.

7. A resistance measuring method for measuring a resistance value of a measurement target resistor in a resistance measuring device, the resistance measuring device including: a processor and one or more memory devices communicatively coupled to the processor; an amplifying unit including an amplifier wherein a first voltage is inputted to a first input terminal of the amplifier and a measurement target resistor is disposed between a second input terminal and an output terminal of the amplifier;
a first current supply device that is communicatively coupled to the processor, wherein the one or more memory devices stores instructions operable when executed by the processor to cause the first current supply device to selectively allow flowing of a current of a first current source connected to a power supply voltage to the second input terminal of the amplifier;
a second current supply device that is communicatively coupled to the processor, wherein the instructions stored in the one or more memory devices are further operable when executed by the processor to cause the second current supply device to selectively allow flowing of a current of a second current source connected to a ground terminal to the second input terminal of the amplifier; and
a voltage detection device that is communicatively coupled to the processor, wherein the instructions stored in the one or more memory devices are further operable when executed by the processor to cause the voltage detection device to detect an output voltage of the output terminal of the amplifier multiple times,
the resistance measuring method comprising:
controlling the voltage detection device to detect a first output voltage of the output terminal of the amplifier in a state where the current of the first current source flows in a forward direction to the measurement target resistor by controlling the first current supply device;
controlling the voltage detection device to detect a second output voltage of the output terminal of the amplifier in a state where the current of the second current source flows in a reverse direction to the measurement target resistor by controlling the second current supply device; and
calculating a resistance value of the measurement target resistor based on the detected first output voltage and the detected second output voltage.

8. The resistance measuring method of claim 7, further comprising:
- controlling the voltage detection device to detect a third output voltage of the output terminal of the amplifier in a state where the current of the first current source flows in a forward direction to the measurement target resistor by controlling the first current supply device and the current of the second current source flows in a reverse direction to the measurement target resistor by controlling the second current supply device;
- controlling the voltage detection device to detect a fourth output voltage of the output terminal of the amplifier in a state where the flowing of the current of the first current source and the current of the second current source to the measurement target resistor is interrupted by controlling the first current supply device and the second current supply device;
- calculating a difference between a current value of the first current source and a current value of the second current source based on a difference between the detected third output voltage and the detected fourth output voltage; and
- correcting the calculated resistance value of the measurement target resistor based on the difference between the current value of the first current source and the current value of the second current source.

* * * * *